(12) United States Patent
Kosub

(10) Patent No.: US 8,877,075 B2
(45) Date of Patent: Nov. 4, 2014

(54) APPARATUSES AND METHODS FOR GAS MIXED LIQUID POLISHING, ETCHING, AND CLEANING

(75) Inventor: Johann Kosub, Neutraubling (DE)

(73) Assignee: Infineon Technologies AG, Neubiberg (DE)

( * ) Notice: Subject to any disclaimer, the term of this patent is extended or adjusted under 35 U.S.C. 154(b) by 63 days.

(21) Appl. No.: 13/363,998

(22) Filed: Feb. 1, 2012

(65) Prior Publication Data

US 2013/0196506 A1   Aug. 1, 2013

(51) Int. Cl.
*B44C 1/22* (2006.01)
*H01L 21/461* (2006.01)

(52) U.S. Cl.
USPC ............... 216/38; 216/41; 216/47; 216/57; 216/90; 216/91; 216/95; 216/96; 216/107; 438/667; 438/687; 438/692; 156/345.1; 156/345.11; 156/345.18

(58) Field of Classification Search
USPC ......... 216/38, 41, 47, 57, 90, 91, 95, 96, 107; 438/667, 687, 692; 156/345.1, 345.11, 156/345.18
See application file for complete search history.

(56) References Cited

U.S. PATENT DOCUMENTS

| | | | |
|---|---|---|---|
| 5,340,437 A * | 8/1994 | Erk et al. ................ | 438/747 |
| 6,039,055 A | 3/2000 | Akatsu | |
| 6,054,062 A * | 4/2000 | Calio et al. ............... | 438/745 |
| 6,610,213 B1 * | 8/2003 | Schwab et al. ........... | 216/83 |
| 6,740,595 B2 | 5/2004 | Kudelka et al. | |
| 6,869,889 B1 * | 3/2005 | Brask et al. .............. | 438/746 |
| 6,903,015 B2 | 6/2005 | Matsui et al. | |
| 6,992,009 B2 | 1/2006 | Kodera et al. | |
| 7,037,842 B2 * | 5/2006 | Verhaverbeke et al. .... | 438/704 |
| 7,140,955 B2 * | 11/2006 | Nabeya ..................... | 451/287 |
| 7,431,861 B2 * | 10/2008 | Toda et al. ................ | 216/93 |
| 7,727,891 B2 | 6/2010 | Matsui et al. | |
| 8,143,166 B2 * | 3/2012 | Zhao et al. ............... | 438/692 |
| 2004/0127051 A1 * | 7/2004 | Lee ........................... | 438/692 |
| 2004/0177655 A1 | 9/2004 | Kodera et al. | |
| 2004/0222100 A1 | 11/2004 | Basol | |
| 2008/0227297 A1 * | 9/2008 | Matsui et al. ............. | 438/693 |
| 2011/0130009 A1 * | 6/2011 | Kumnig et al. ........... | 438/745 |

* cited by examiner

*Primary Examiner* — Nadine Norton
*Assistant Examiner* — Christopher Remavege
(74) *Attorney, Agent, or Firm* — Slater & Matsil, L.L.P.

(57) ABSTRACT

In accordance with an embodiment of the present invention, a method of polishing a device includes providing a layer having a non-uniform top surface. The non-uniform top surface includes a plurality of protrusions. The method further includes removing the plurality of protrusions by exposing the layer to a fluid that has gas bubbles and a liquid.

37 Claims, 13 Drawing Sheets

APPARATUSES AND METHODS FOR GAS MIXED LIQUID POLISHING, ETCHING, AND CLEANING

TECHNICAL FIELD

The present invention relates generally to polishing, etching, and cleaning, and more particularly to apparatuses and methods for gas mixed liquid for polishing, etching, and cleaning.

BACKGROUND

Polishing processes such as planarization are used in many different industries. For example, conventional semiconductor device fabrication requires many polishing processes. Similarly, etching and cleaning are common process steps in semiconductor industry. In conventional processes, etching, cleaning, and polishing are performed using different equipment and processes, which increases process costs.

Due to continuous scaling of semiconductor devices, new materials and structural features are continuously introduced. Further, feature dimensions are being reduced continuously requiring improved process sensitivity while reducing process margin/tolerances. For example, this requires improved etch selectivity while reducing etch errors. Conventional polishing processes are mechanical processes, which are very sensitive to design/layout and position along the wafer. Consequently, there is a constant need to improve etching, cleaning, and polishing processes while reducing production costs.

SUMMARY OF THE INVENTION

These and other problems are generally solved or circumvented, and technical advantages are generally achieved, by illustrative embodiments of the present invention.

In accordance with an embodiment of the present invention, a method of polishing a device comprises providing a layer having a non-uniform top surface. In one embodiment, the layer may be disposed over a substrate. The non-uniform top surface includes a plurality of protrusions. The method further comprises removing the plurality of protrusions by exposing the layer to a fluid comprising gas bubbles and a liquid.

In accordance with an embodiment of the present invention, a method of fabricating a semiconductor device comprises forming a copper layer having a non-uniform top surface over a substrate and planarizing the non-uniform top surface by exposing the copper layer to a flow of a fluid. The fluid comprises gas bubbles and a liquid.

In accordance with an embodiment of the present invention, a processing tool comprises a chuck for holding a substrate and a nozzle disposed in a central opening of the chuck. The tool further includes a first gas inlet coupled to the nozzle and a liquid inlet coupled to the nozzle. The nozzle is configured to release a fluid comprising gas bubbles and a liquid.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 1, which includes

FIG. 9, which includes FIGS. 9A-9C, illustrates an etch tool in accordance with embodiments of the invention, wherein FIGS. 9A and 9C illustrate cross-sectional views and FIG. 9B illustrates a top view;

FIG. 10, which includes

FIG. 11, which includes

FIG. 12, which includes

FIG. 13, which includes

FIG. 14, which includes

FIG. 15, which includes FIG. 16, which includes

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Conventional etching and cleaning processes are limited by the type of process (e.g., plasma, wet etc.) and the available etchants. Similarly, polishing processes are restricted by the available polishing medium. Embodiments of the invention overcome these limitations by teaching a new type of etching/cleaning/polishing process by changing the fundamental mechanism of these processes using a gas-liquid mixture.

An embodiment of the invention relating to a method of polishing/etching will be described using FIGS. 1-8. An alternative embodiment of polishing/etching will be described using FIG. 13. An embodiment of the invention for cleaning substrates will be described using FIG. 14. An embodiment of the invention for polishing substrates will be described using FIG. 15. Embodiments of the invention relating to a process tool for polishing/etching will be described using FIGS. 9-12.

Figure 1A:
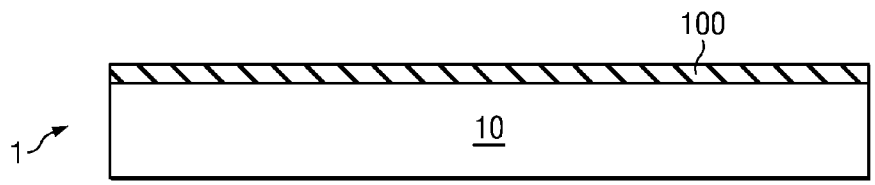
FIGS. 1A and 1B, illustrates a cross-sectional view of a semiconductor device after formation of the device regions and during the formation of the lower metallization levels in accordance with an embodiment of the invention.
Figure 1B:
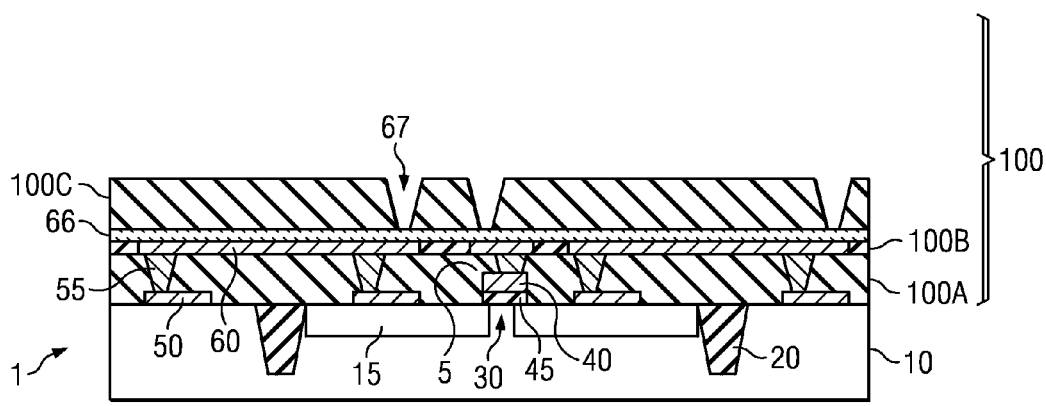

FIG. 1, which includes FIGS. 1A and 1B, illustrates a cross-sectional view of a semiconductor device after formation of the device regions and during the formation of the lower metallization levels in accordance with an embodiment of the invention.

FIG. 1 illustrates a top cross-sectional view of the chip 1, which (not shown to scale) contains active circuitry disposed inside it. The active circuitry contains the device regions and includes necessary transistors, resistors, capacitors, inductors or other components used to form integrated circuits.

Next, metallization layers are formed in an insulating layer 100 over the device regions to electrically contact and interconnect the active devices. The metallization layers and device regions together form a complete functional integrated circuit. In other words, the electrical functions of the chip 1 can be performed by the interconnected active circuitry. In logic devices, the metallization may include many layers, e.g., nine or more, of copper or alternatively of other metals. In memory devices, such as DRAMs, the number of metal levels may be less.

A magnified cross-sectional portion of the chip 1 is illustrated in FIG. 1B. The semiconductor device is illustrated after the formation of device regions such as transistors regions within the substrate 10. The device regions may include any type of device including active devices such as transistors, diodes, thyristors, etc. as well as passive devices such as resistors, inductors etc.

As will be illustrated also in subsequent process steps, metallization layers with metal lines and vias are formed over the substrate. The metal lines and the vias are formed within an insulating layer 100, which is being fabricated. The insulating layer 100 comprises $SiO_2$ such as tetra ethyl oxysilane (TEOS) or fluorinated TEOS (FTEOS) in one or more embodiments. In various embodiments, the insulating layer 100 may comprise insulating materials typically used in semiconductor manufacturing for inter-level dielectric (ILD) layers such as doped glass (BPSG, PSG, BSG), organo silicate glass (OSG), carbon doped oxides (CDO), fluorinated silicate glass (FSG), spin-on glass (SOG), or low-k insulating materials, e.g., having a dielectric constant of about 4 or less. The insulating layer 100 may also comprise dielectrics having a dielectric constant of about 3 or lower such as dense SiCOH or a porous dielectrics, as examples.

In various embodiments, the insulating layer 100 may comprise a plurality of layers. In one embodiment, each subsequent layer of metal line is formed within another insulating layer. As a further example, the insulating layer 100 comprises a first insulating layer 100A, a second insulating layer 100B, a third insulating layer 100C. Each of these layers of the insulating layer 100 may comprise a thickness of about 100 nm to about 500 nm, for example, although alternatively, they may comprise other dimensions.

The substrate 10 may include many devices such as a transistor 5 illustrated in FIG. 1B. The transistor 5 comprises a gate 40, a gate dielectric 45, and a channel region 30 disposed between source/drain regions 15. Adjacent devices may be isolated using isolation regions 20. Active areas that include transistors (e.g., CMOS transistors) may be separated from one another by isolation regions 20, e.g., shallow trench isolation. The source/drain regions 15 (and other device regions) are coupled to other devices on the substrate 10 and to input/output contacts through contact regions 50. The contact regions 50 may be disposed within the substrate 10 and may extend above the substrate 10 (as illustrated). In one or more embodiments, the contact regions 50 comprise silicide regions. The first insulating layer 100A covers the contact regions 50 and surrounds the gate 40. The transistor 5 may comprise additional structures such as offset spacers around the gate 40 and the gate dielectric 45. Contact plugs 55 are disposed within the first insulating layer 100A to couple with device regions in the substrate 10 through the contact regions 50.

A second insulating layer 100B is formed over the first insulating layer 100A. An etch stop liner and dielectric diffusion barriers may be formed before depositing the second insulating layer 100B over the first insulating layer 100A. Such layers may be used to cap the metal lines and may comprise dielectric materials such as silicon nitride (SiN), silicon carbide (SiC), silicon carbo nitrides (SiCN) or other suitable dielectric barrier layers or combinations thereof. First metal lines 60 are formed within the second insulating layer 100B.

Further, metal layers are fabricated in various embodiments. The number of metal layers depends on the type of circuit and semiconductor device being fabricated. Only as an illustration seven metal layers are fabricated in this embodiment.

In various embodiments of the invention, the metal and via levels are formed using a single damascene process or a dual damascene process. In a single damascene process, a single layer of insulating material is patterned with a pattern for conductive features, such as conductive lines, conductive vias. In contrast, in a dual damascene process, the vias and metals lines are patterned for conductive features and filled in a single fill step with a conductive material.

As an illustration, the metal lines and vias within the third insulating layer 100C will be formed using a dual damascene process. As illustrated, an etch stop layer 66 is formed on the second insulating layer 100B. The etch stop layer 66 comprises SiCHN although, in other embodiments, other nitrides or other suitable materials may be used. Examples of etch stop layer 66 include materials such as silicon nitride (SiN), silicon oxynitride (SiON), silicon carbide (SiC) or silicon carbo nitride (SiCN), titanium nitride in various embodiment. The etch stop layer 66 may be deposited using a vapor deposition process such as chemical vapor deposition, plasma vapor deposition etc.

A third insulating layer 100C is formed over the etch stop layer 66. The third insulating layer 100C may either be spin-on material or deposited by vapor deposition techniques such as chemical vapor deposition, plasma vapor deposition. A first hard mask layer (not shown) is deposited over the third insulating layer 100C. The first hard mask layer comprises $SiO_2$ such as tetra ethyl oxysilane (TEOS), silicon carbide (SiC) or carbon doped glass, but in various embodiments other materials may be used. Using conventional lithography techniques, the first hard mask layer is patterned for vias. Using the first hard mask layer as an etch mask, a plurality of holes 67 for forming vias is patterned within the third insulating layer 100C, i.e., the pattern from the first hard mask layer is transferred to the third insulating layer 100C. In various embodiments, the plurality of holes 67 may be formed using an anisotropic etch process, such as reactive ion etch. The etch stop layer 66 stops the etching process from exposing (as well as etching through) the underlying first metal lines 60 during the formation of the plurality of holes 67.

Figure 2:
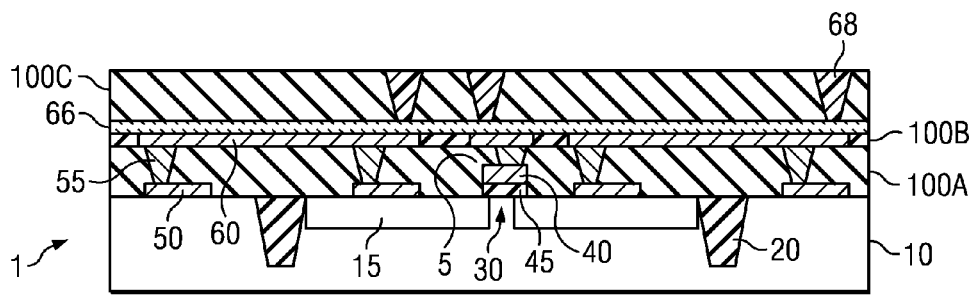
FIG. 2 illustrates the semiconductor device after filling a plurality of holes with a sacrificial material in accordance with an embodiment of the invention.

Next, as illustrated in FIG. 2, the plurality of holes 67 is filled with a sacrificial material 68. The sacrificial material 68 is chosen to have a high etch selectivity between the etch stop layer 66 and the sacrificial material 68. In one or more embodiments, the sacrificial material 68 may comprise a low-k dielectric material or photo resist material. In one embodiment, the sacrificial material 68 comprises an anti-reflective coating. The sacrificial material 68 comprises a planarizing spin on material, or other bottom anti-reflective coating materials (BARC). The sacrificial material 68 is over-filled to form a smooth surface and the excess sacrificial material 68 over the third insulating layer 100C is cleaned or etched back.

Figure 3:
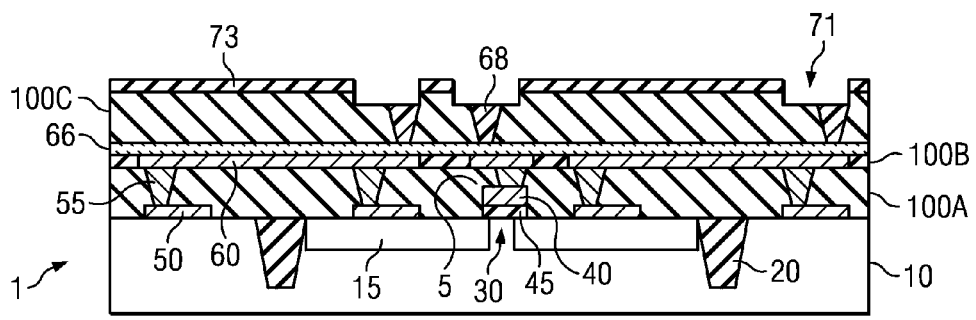
FIG. 3 illustrates the semiconductor device after forming patterns for metal lines within an insulating layer in accordance with an embodiment of the invention.

As next illustrated in FIG. 3, patterns for metal lines are formed within the third insulating layer 100C. A second hard mask layer 73 is deposited over the third insulating layer 100C. The second hard mask layer 73 comprises $SiO_2$ such as tetra ethyl oxysilane (TEOS), silicon carbide (SiC) or carbon doped glass, but in various embodiments other materials may be used. Using lithography techniques, the second hard mask layer 73 is patterned for metal lines.

Using the second hard mask layer 73 as an etch mask, a plurality of trenches 71 for forming metal lines is patterned within the third insulating layer 100C, i.e., the pattern from the second hard mask layer 73 is transferred to the third insulating layer 100C. In various embodiments, the plurality of trenches 71 may be formed using an anisotropic etch process, such as a reactive ion etch. The plurality of trenches 71 exposes a top surface of the sacrificial material 68 in the plurality of holes 67.

Figure 4:
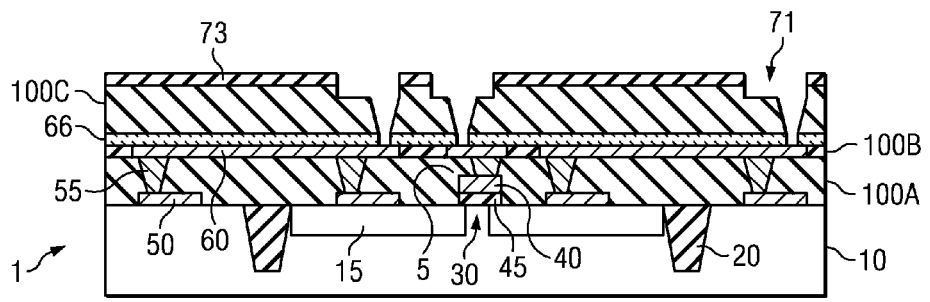
FIG. 4 illustrates the semiconductor device after forming a single opening for metal lines and vias in accordance with an embodiment of the invention.

Referring to FIG. 4, the sacrificial material 68 from the plurality of holes 67 is removed forming a single opening for metal lines and vias. After removing the sacrificial material 68, the exposed etch stop layer 66 in the opening is removed, for example, using a wet etch.

Figure 5:
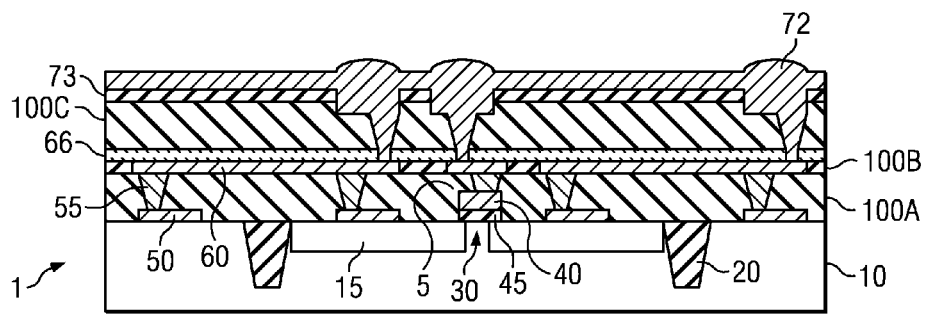
FIG. 5 illustrates the semiconductor device after over-filling the opening for metal lines and vias with copper in accordance with an embodiment of the invention.

Next, as illustrated in FIG. 5, in various embodiments, an over-filled copper layer 72 is deposited. A barrier layer such as a diffusion barrier layer is deposited over the sidewalls of the plurality of trenches 71 and the plurality of holes 67. The barrier layer may comprise titanium, titanium nitride, tantalum, tantalum nitride, and other suitable materials that prevent diffusion of copper into the third insulating layer 100C. The barrier layer may be deposited using sputter deposition or other vapor deposition techniques in various embodiments. A seed layer is deposited on the diffusion barrier layer. The seed layer is a copper seed for subsequent copper plating. The seed layer may be deposited using sputter deposition in one embodiment.

Copper 72 is filled into the plurality of trenches 71 and the plurality of holes 67 using an electro-chemical deposition process. Consequently, the copper 72 is over-filled and forms over the second hard mask layer 73. In one embodiment, the copper 72 comprises pure metallic copper. It is understood that a pure metal such as pure metallic copper may include trace impurities. Copper 72 may be an alloy of copper. Accordingly, copper 72 may include impurities as well as other additive metals in various embodiments. Because of the faster deposition rate of copper within narrow vias compared to open areas, the layer of copper 72 is non-uniform and has to be planarized.

Figure 6:
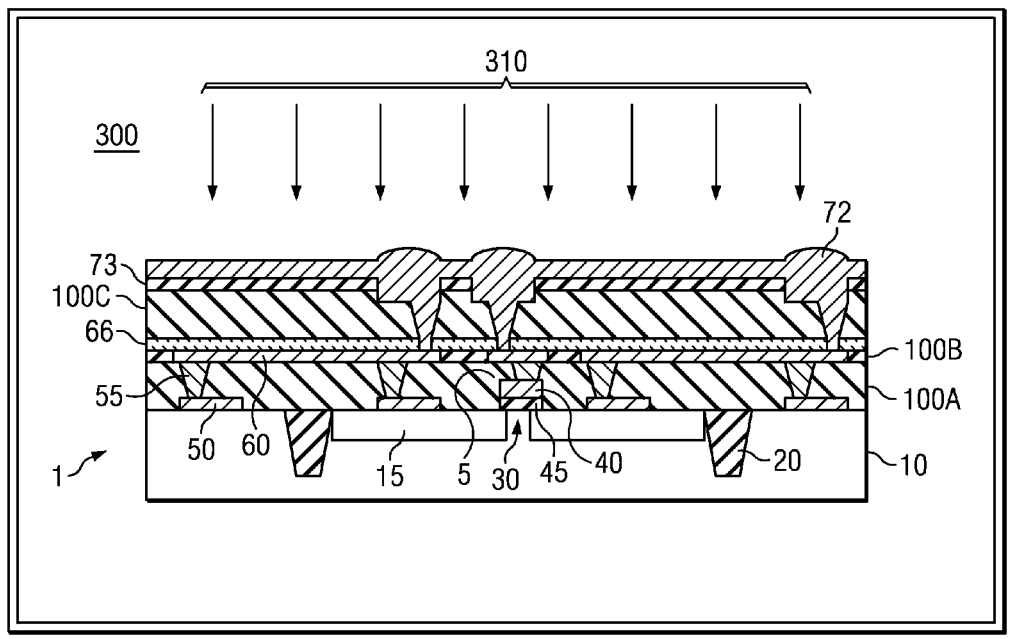
FIG. 6 illustrates the semiconductor device during polishing/etching using an super-saturated fluid in accordance with an embodiment of the invention.

Referring to FIG. 6, the chip 1 being fabricated is placed with an etch chamber 300 and subjected to an etchant 310. In one embodiment, the chip 1 is placed face down when being subjected to the etchant 310. In various embodiments, the etchant 310 comprises a gas super-saturated liquid. In one or more embodiments, the chip 1 is subjected to a turbulent flow of the etchant 310.

In various embodiments, the etchant 310 comprises a fluid and a gas. The fluid comprises sulfuric acid, hydrogen peroxide, hydrofluoric acid, ammonium fluoride, phosphoric acid, acetic acid, potassium hydroxide, ammonium hydroxide, nitric acid, other organic acids, and combinations thereof. In various embodiments, the gas comprises oxygen, nitrogen, ozone, hydrogen peroxide, hydrogen, and argon.

While the etchant 310 is in a liquid phase, it is super-saturated because of the large amount of trapped gas within it. The super-saturated liquid etchant 310 impacts the surface of the copper 72. Upon contacting the surface of copper 72 (as well as prior to contacting), the gas phase partially separates from the liquid phase. The gas phase partially agglomerates into bubbles. These bubbles eventually rise and move around. Thus, the etchant 310 has multiple types of interaction with the surface of copper 72 because of the unique properties of the super-saturated liquid: chemical effect of the super-saturated liquid, reaction with bubbles in the etchant 310, reaction with the trapped gas in the etchant 310 such as the bubbles and gas layers, and reaction with the liquid phase during and after separation. This leads to a new fundamental mechanism in which the chemical agents are forced to go around the gas bubbles and through gas layers before contacting the surface of the material being treated, e.g., surface of the copper 72. The result is a diffusion dominated/controlled etching process because the diffusion of the chemical agents around the gas bubbles and through the gas layers may be the rate limiting processes. Advantageously, keeping the chip 1 face down increases the amount of trapped gas and therefore the etching action. Further, the isolating and encapsulating nature of the moving bubbles may cause further interactions with the surface being treated. For example, the particles removed from the surface of the copper 72 may be transported away. Because of these unique properties of the etchant, the etchant can perform polishing processes, which conventionally are performed by chemical and mechanical processes in a chemical mechanical polishing (CMP) step. Therefore, the CMP step may be avoided using embodiments of the invention.

Figure 7:
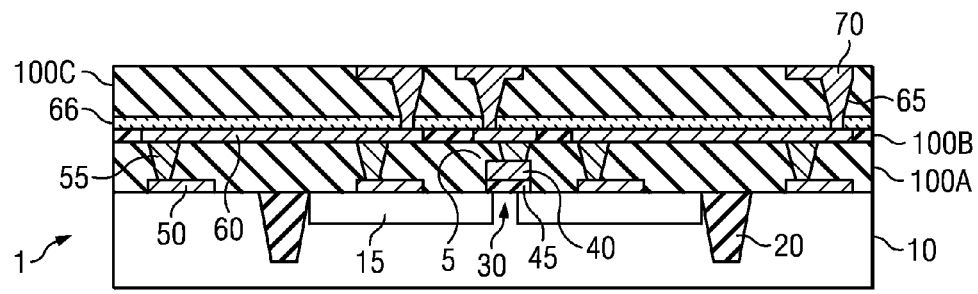
FIG. 7 illustrates the semiconductor device after planarization using the super-saturated fluid in accordance with an embodiment of the invention.

The etchant 310 planarizes the surface of the copper 72 during the etching. As illustrated in FIG. 7, a planarised copper layer is formed after the exposure to the super-saturated etchant 310.

Figure 8:
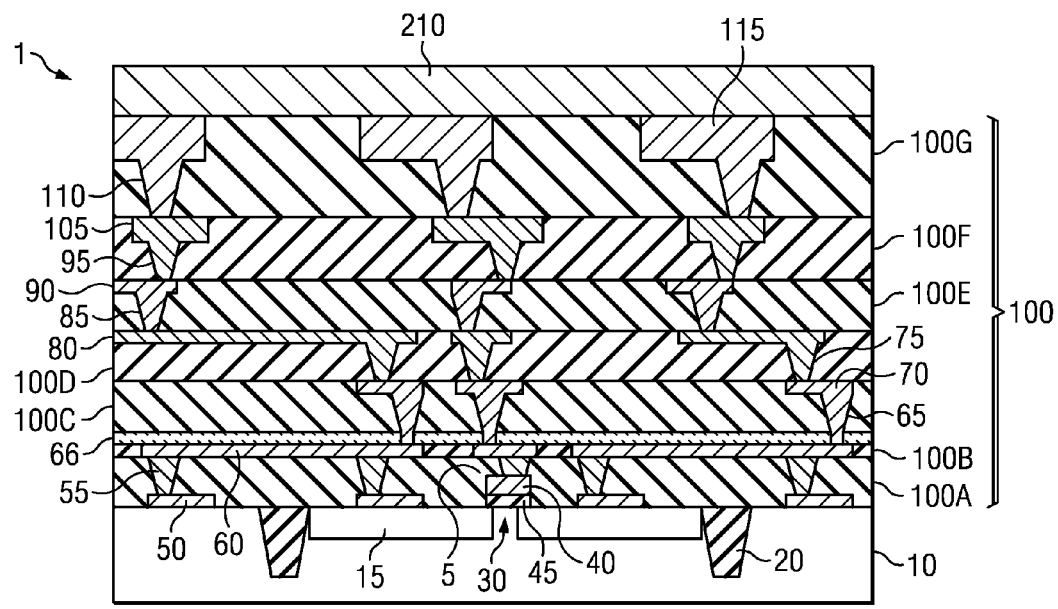
FIG. 8 illustrates the semiconductor device after forming subsequent metallization layers similarly in accordance with an embodiment of the invention.

Referring to FIG. 8, subsequent metallization layers may be similarly formed. For example, the insulating layer 100 further comprises a fourth insulating layer 100D, a fifth insulating layer 100E, a sixth insulating layer 100F, a seventh insulating 100G, and an eighth insulating 100H. Each of these layers of the insulating layer 100 may comprise a thickness of about 100 nm to about 500 nm, for example, although alternatively, they may comprise other dimensions. Thus, in the illustrated example, six metal levels comprising $M_1$, $M_2$, $M_3$, $M_4$, $M_5$, and $M_6$ are stacked vertically and connected by contact and via levels $V_1$, $V_2$, $V_3$, $V_4$, $V_5$, and $V_6$. In other embodiments, more or less number of metal levels and via levels may be used.

A fourth insulating layer 100D is formed over the third insulating layer 100C. Second vias 75 and third metal lines 80 are formed within the fourth insulating layer 100D. A fifth insulating layer 100E is formed over the fourth insulating layer 100D. Third vias 85 and fourth metal lines 90 are formed within the fifth insulating layer 100E. A sixth insulating layer 100F is formed over the fifth insulating layer 100E. Fourth vias 95 and fifth metal lines 105 are formed within the sixth insulating layer 100F. A seventh insulating layer 100G is formed over the sixth insulating layer 100F. Fifth vias 110 and sixth metal lines 115 are formed within the seventh insulating layer 100G. An eighth insulating layer 100H is formed over the seventh insulating layer 100G. As illustrated in FIG. 8, in one or more embodiments, the thickness of the metal lines and the vias may increase moving up from lower level metallization to the upper level metallization. In various embodiments, each of the metal lines and vias may be planarized using the super-saturated liquid etchant described above.

Figure 9A:
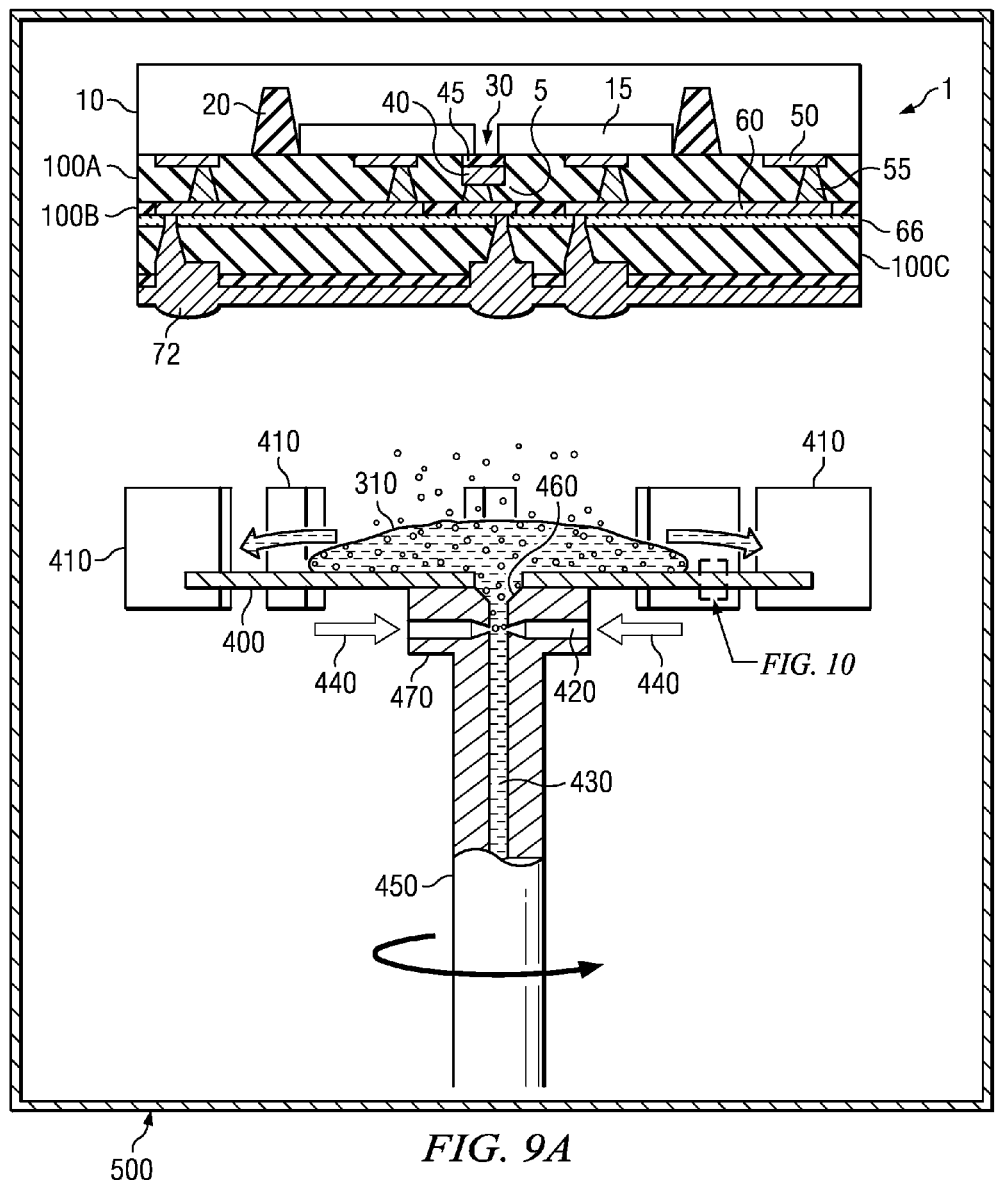
Figure 9B:
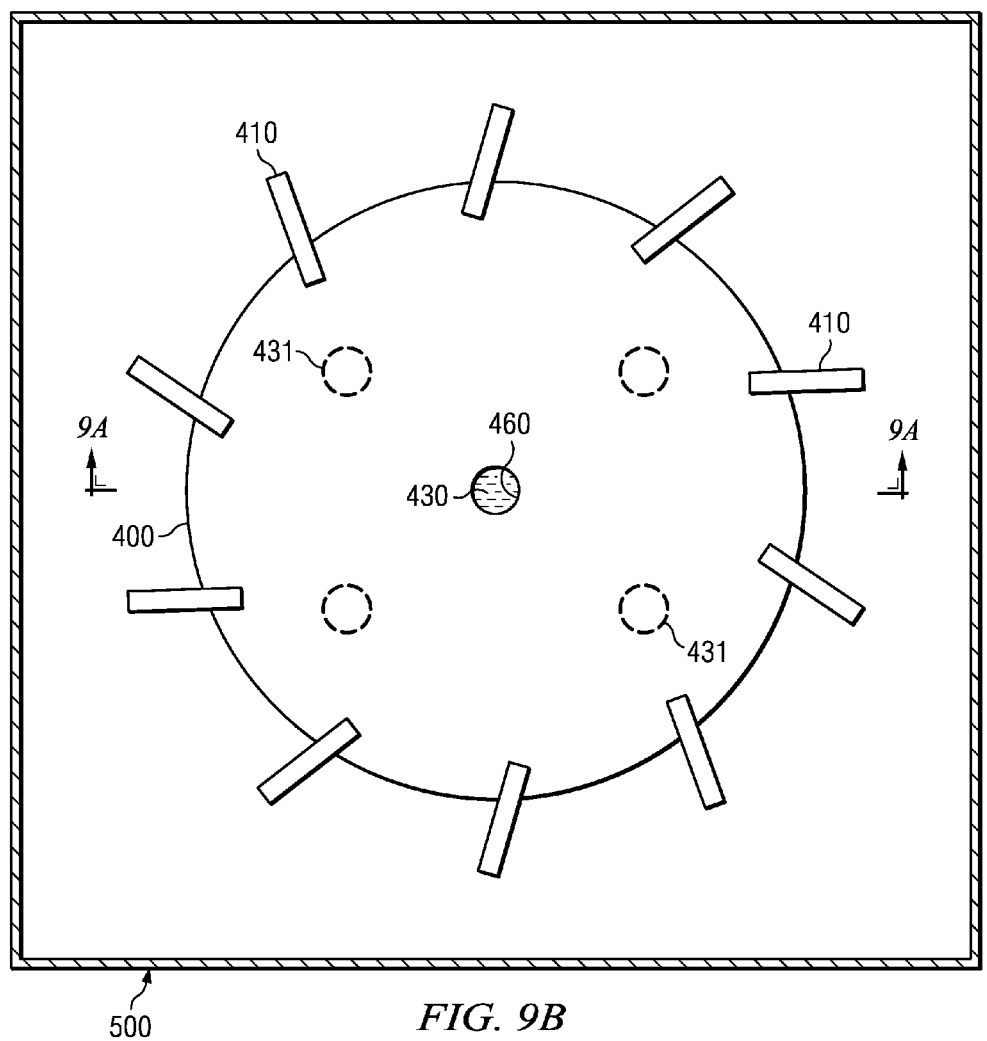
Figure 9C:
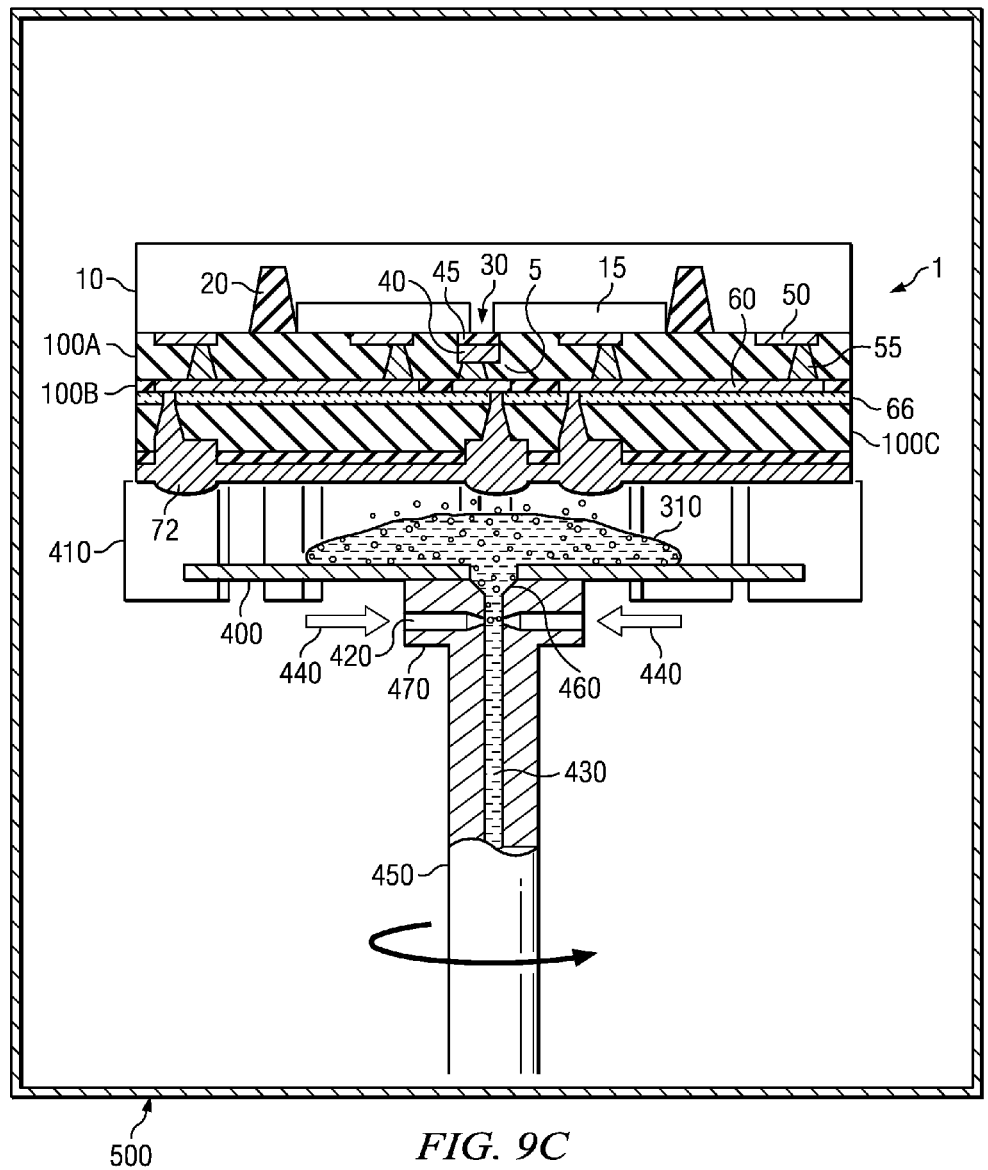

FIG. 9, which includes FIGS. 9A-9C, illustrates an etch tool in accordance with embodiments of the invention, wherein FIGS. 9A and 9C illustrate cross-sectional views and FIG. 9B illustrates a top view.

FIG. 9A illustrates a chip 1 being processed in an etch chamber 500 of the etch tool. In one embodiment, the chip 1 illustrated in FIG. 9A may be the chip 1 during fabrication as described previously in FIG. 5 and the tool chamber 500 may be used as the etch chamber 300 as described with respect to FIG. 6. As illustrated, the substrate 10 is placed upside down so that the top surface with the device regions and metallization layers is facing down towards a chuck 400 below. In some embodiments, the substrate 10 may be rotated around a central axis.

The chuck 400 has a nozzle 460 or orifice for passage of a fluid 430. The chuck 400 may have further nozzles 431 (optional) in some embodiments. The fluid 430 is fed in through the column 450. The fluid 430 includes the liquid phase of the etchant. Vents 420 provide inlets for mixing a gas 440 with the fluid 430 in a mixing chamber 470 under the chuck 400. Both or either one of the fluid 430 or the gas 440 may be injected into the mixing chamber 470 to change the amount of the trapped gas 440 in the etchant formed from fluid 430.

The mixing of the gas 440 with the fluid 430 changes the phase of the gas 440 from a gas phase to a liquid phase due to the dissolution of the gas into the fluid 430. Thus, the amount of super-saturation of the trapped gas can be changed by changing the mixing process, the relative amounts of gas and fluid, temperature, pressure etc. The super-saturation ratio is the ratio of the actual amount of trapped gas in solution compared to the amount of trapped gas predicted by equilibrium at the same conditions of temperature and pressure. In various embodiments, a super-saturated liquid etchant is generated by the mixing of the gas 440 and the fluid 430. This super-saturated liquid etchant 310 is released on the top surface of the chuck 400 through the nozzle 460. However, in various embodiments, the trapped gas in the etchant 310 is not merely a gas dissolved in a fluid 430, but rather the etchant 310 includes gas bubbles and gas layers as well when the etchant 310 contacts the surface to be treated.

In various embodiments, the fluid 430 comprises sulfuric acid, hydrogen peroxide, hydrofluoric acid, ammonium fluoride, phosphoric acid, acetic acid, potassium hydroxide, ammonium hydroxide, nitric acid, and combinations thereof.

In various embodiments, the gas 440 comprises oxygen, nitrogen, ozone, hydrogen peroxide, hydrogen, and argon.

In various embodiments, the flow of the etchant 310 on the top surface of the chuck 400 is very turbulent. The turbulence of the etchant 310 may be controlled to increase/decrease the relative ratios of the etching rate and the polishing rate. Further, in various embodiments, the top surface of the chuck 400 may be concave or convex to improve the flow of the etchant 310.

During processing, gas bubbles form, grow bigger, and eventually rise and burst out of the fluid 430. In various embodiments, the super-saturated liquid etchant 310 holds or maintains the gas for a limited amount of time, which may be controlled. For example, under equilibrium, some amount of air or other gases may already be trapped in the fluid 430 as small microscopic bubbles. In some embodiments, the fluid 430 is cleaned such that the amount of trapped gas in the fluid 430 is lower than equilibrium, i.e., the liquid is under-saturated. This may improve the meta-stability of the super-saturated liquid, i.e., gas bubbles take longer to burst out of the super-saturated liquid longer. This is because pre-existing gas bubbles may behave like nucleation sites, which results in faster separation of the gas 440 from the fluid 430.

During processing, the top surface of the copper 72 contacts this super-saturated liquid etchant 310 and may be etched and planarized simultaneously due to the diffusion controlled etching process. Eventually the gas 440 separates (rises above the etchant 310) from the fluid 430. The remaining fluid 430 flows laterally out of the chuck and is collected below the chuck 400 in the tool chamber 500.

In various embodiments, a plurality of blades 410 is disposed around the chuck 400. The plurality of blades 410 is oriented in such a fashion to generate a low pressure area above the surface of the chuck 400, e.g., due to the curvature of the blades when being rotation. The pressure differential increases the flow of gas 440 though the vents 420 into the mixing chamber 470. Thus, in some embodiments, the plurality of blades 410 may be used to control the amount of gas in the liquid. For example, the rotation of the blades may be increased (by rotating the chuck faster) to lower the pressure above the chuck, which increases the gas flowing into the mixing chamber 470 through the vents 420.

In some embodiments, the plurality of blades 410 may also be used to support the substrate 10 or the chuck 400. In one or more embodiments, the plurality of blades 410 may be used to mount the substrate 10 and/or to rotate the substrate 10 (FIG. 9C). Thus, separate fasteners may not be needed to hold the substrate 10 over the chuck 400.

In various embodiments, the flow of the fluid 430 may be reduced or completely cut-off after the etching/polishing process. Thus, the substrate 10 may be dried within the tool.

Figure 10A:
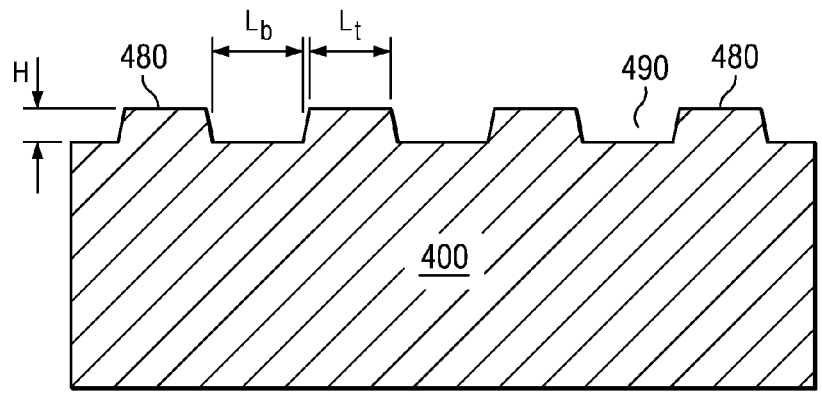
FIGS. 10A-10C, illustrates a magnified cross-sectional view of the surface of the chuck of FIG. 9 in accordance with embodiments of the invention.
Figure 10B:
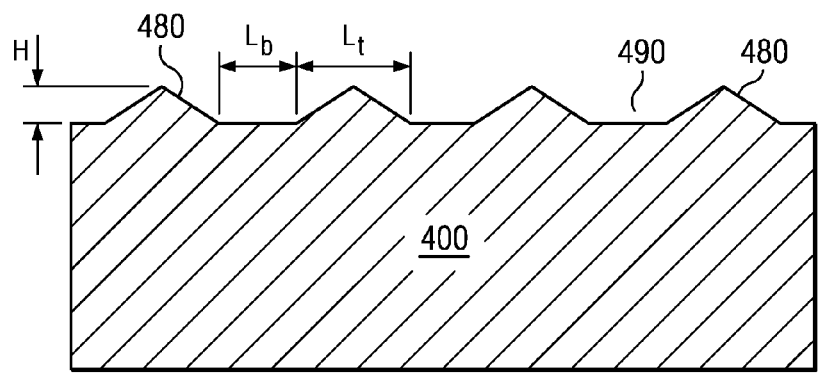
Figure 10C:
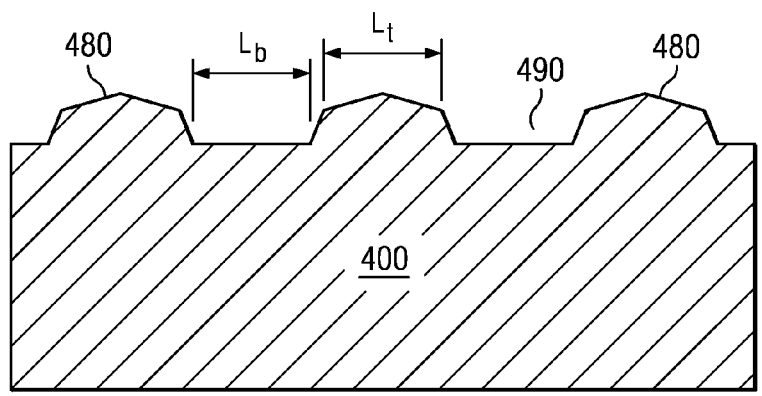

FIG. 10, which includes FIGS. 10A-10C, illustrates a magnified cross-sectional view of the surface of the chuck 400 of FIG. 9 in accordance with embodiments of the invention. FIG. 9 highlights the cross sectional area illustrated in FIG. 10.

In various embodiments, the surface of the chuck 400 is textured to control the flow of the etchant 310. In one or more embodiments, the textured surface of the chuck 400 helps to increase the turbulence of the etchant 310 as it mixes up the settling liquid with the rising gas.

As illustrated in FIG. 10A, the top surface of the chuck 400 is textured and may include ridges 480 and valleys 490. The length of the valley floor $L_b$ may be related to the length of the ridge ceiling $L_t$ in one or more embodiments. In one or more embodiments, the length of the valley floor $L_b$ may be about the same as the length of the ridge ceiling $L_t$. In one or more embodiments, the length of the valley floor $L_b$ may be at least twice the length of the ridge ceiling $L_t$.

In various embodiments, the textured surface may have other shapes. For example, as illustrated in FIG. 10B, the ridges 480 and valleys 490 may have a sharper peak than in the prior embodiment. In FIG. 10B, the ridges 480 are formed as a triangle while in another embodiment, as in FIG. 10C, the ridges 480 have a faceted (four-sided) structure.

Figure 11A:
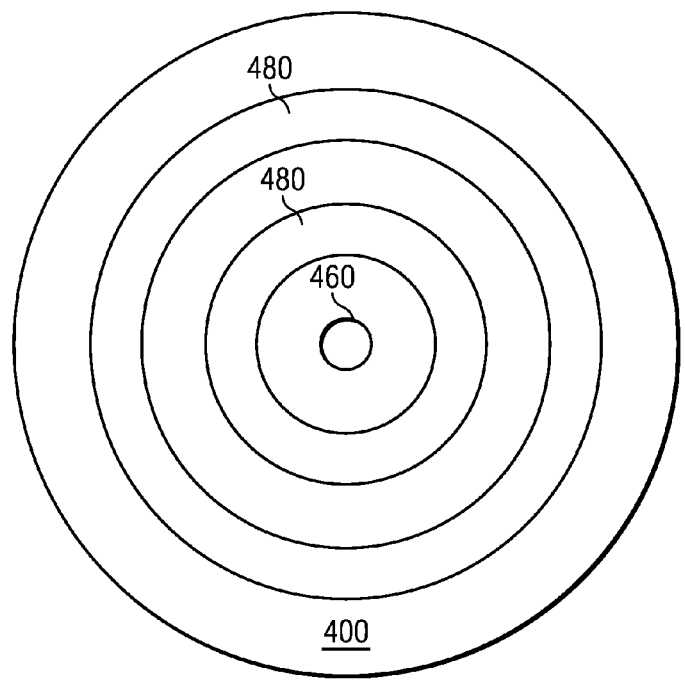
FIGS. 11A-11C, illustrates a top view of the surface of the chuck of FIG. 9 in accordance with embodiments of the invention.
Figure 11B:
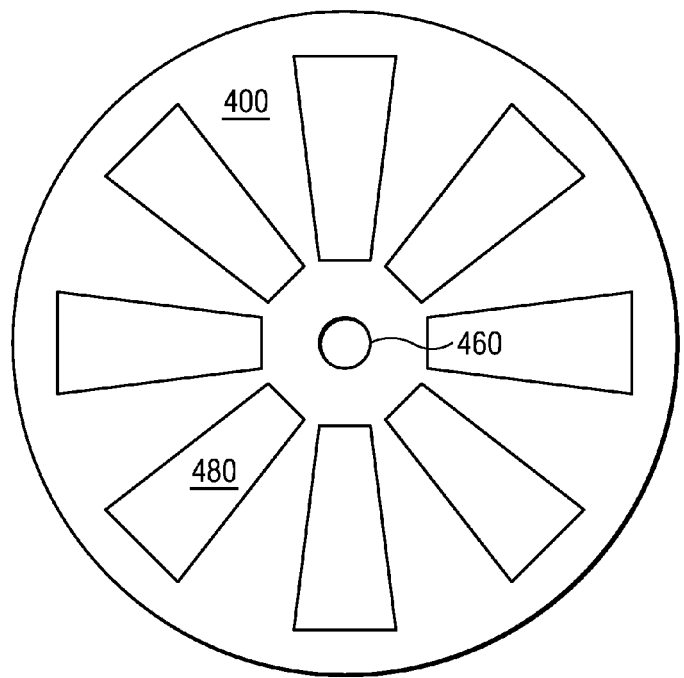
Figure 11C:
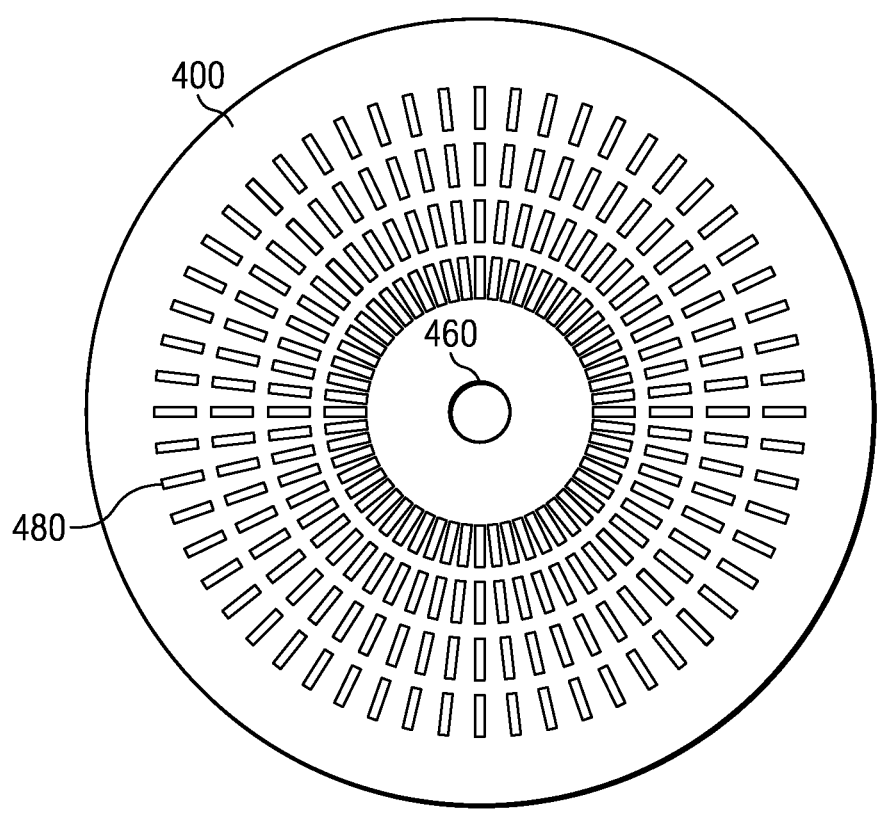

FIG. 11, which includes FIGS. 11A-11C, illustrates a top view of the surface of the chuck 400 of FIG. 9 in accordance with embodiments of the invention.

In various the textured surface may comprise different patterns. In one embodiment, the textured surface may comprise continuous concentric ridges 480 while in another embodiment the textured surface may comprise ridges 480, which are radially aligned. FIG. 11C illustrates another embodiment having a plurality of many ridges 480 formed over the top surface of the chuck 400. Unlike the continuous ridges 480 of FIGS. 11A and 11B, the ridges 480 of FIG. 11C are mesa like structures. In one or more embodiments, the ridges 480 of FIG. 11C have a length of the valley floor $L_b$ and length of the ridge ceiling $L_t$ are smaller than about a 1 µm and about 0.1 µm to about 1 µm in one embodiment.

Figure 12A:
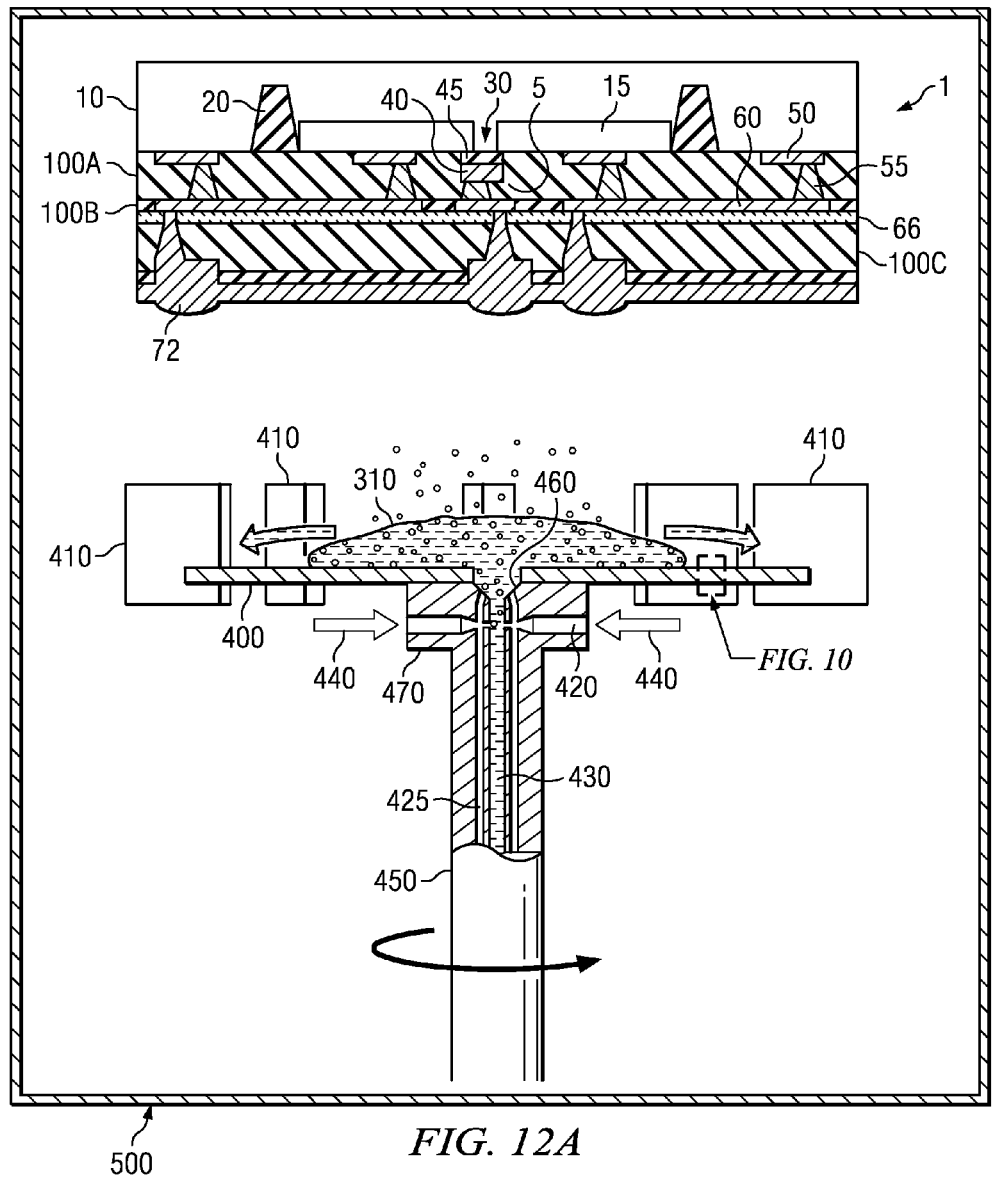
FIGS. 12A and 12B, illustrates an alternative etching/polishing apparatus in accordance with an embodiment of the invention.
Figure 12B:
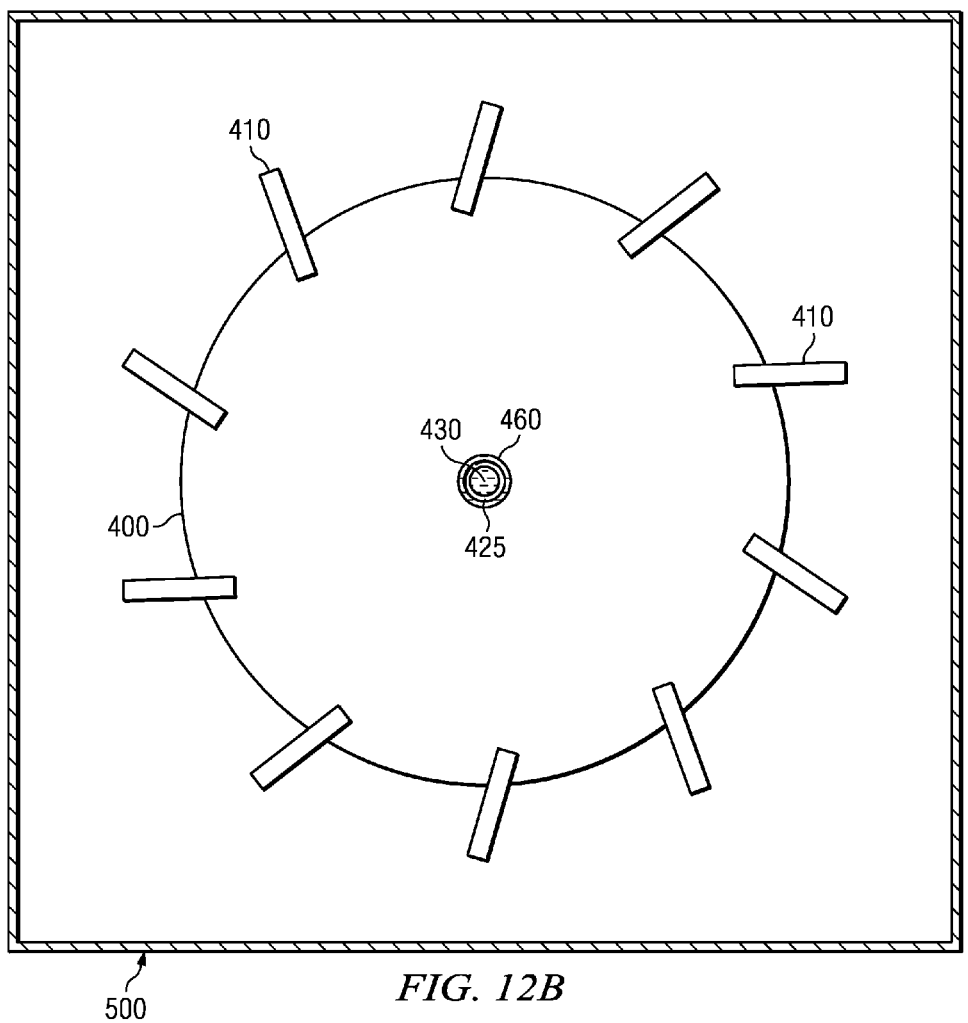

FIG. 12, which includes FIGS. 12A and 12B, illustrates an alternative etching/polishing apparatus in accordance with an embodiment of the invention.

Unlike the embodiment of FIG. 9, this embodiment includes an additional gas inlet 425 for injecting gas in to the mixing chamber 470. Alternatively, the injected gas may be mixed within the nozzle 460. In various embodiments, the additional gas inlet 425 may be separate from the vents 420 so that both injected gas and pressure effects (e.g., arising from the plurality of blades 410) may be deployed simultaneously. The additional gas inlet 425 may be formed as a concentric layer around the main fluid inlet (as shown in FIGS. 12A and 12B) or may be configured as a separate line.

Figure 13A:
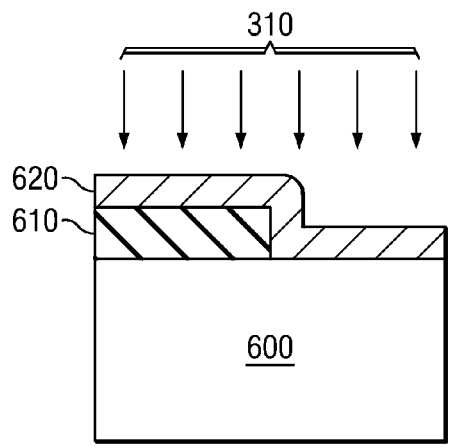
FIGS. 13A and 13B, illustrates a method of etching/polishing in accordance with an alternative embodiment of the invention.
Figure 13B:
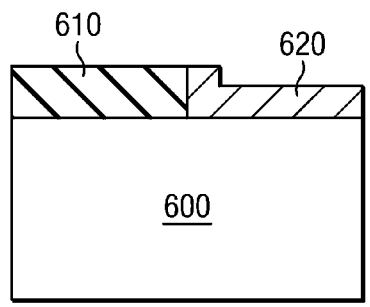

FIG. 13, which includes FIGS. 13A and 13B, illustrates a method of etching/polishing in accordance with an alternative embodiment of the invention.

While the prior embodiment described with respect to FIGS. 1-8 was used to planarize copper, in various embodiments, the super-saturated etchant process may be used to etch and/or polish other structures. For example, embodiments of the invention apply to pattern, etch, polish, any multiple layer structures. Further, embodiments may be applied to any type of polishing processes, for example, microscopic sample preparation and finishing processes including metal polishing.

As an example, FIG. 13A illustrates a patterned layer 610 disposed over a workpiece 600. The workpiece 600 may be the substrate 10 as described previously in one embodiment. In other embodiments, the workpiece 600 may be anything that has a feature to be etched or polished, e.g., a product before final finishing, or a sample for microscopy. A layer 620 to be planarized is formed on the patterned layer 610. In one embodiment, the patterned layer 610 may be the third insulating layer 100C (FIG. 1B), the layer 620 may be copper 72 (FIG. 5).

The workpiece 600 is exposed to a super-saturated liquid etchant 310 as described in prior embodiments. The super-saturated liquid etchant 310 polishes the surfaces of the workpiece 600 having the layer 620. The resulting structure is shown in FIG. 13B.

Figure 14A:
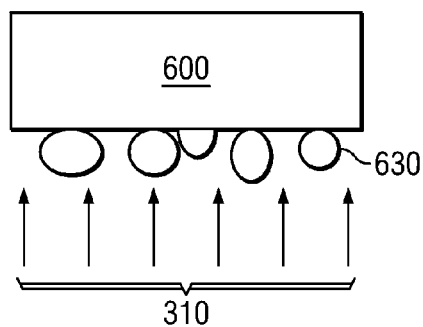
FIGS. 14A and 14B, illustrates an embodiment of the invention applied to cleaning.
Figure 14B:
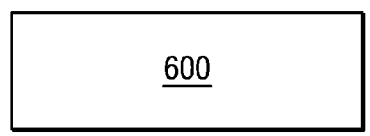

FIG. 14, which includes FIGS. 14A and 14B, illustrates an embodiment of the invention applied to cleaning.

As illustrated in FIG. 14A, the surface to be cleaned of a workpiece 600 may comprise particles 630. Particles 630 may be organic or inorganic in nature and may be formed during processing of the workpiece 600. The workpiece 600 is exposed to an etchant 310 comprising a super-saturated fluid as described previously. During the exposure, the etchant 310 dislodges the particles 630 from the workpiece 600. Next, gas bubbles rising out of the etchant 310 create a protective layer over the workpiece while the heavier liquid with the particles 630 transports them away from the surface of the workpiece 600. FIG. 14B illustrates the workpiece 600 after the removal of the particles 630.

Figure 15A:
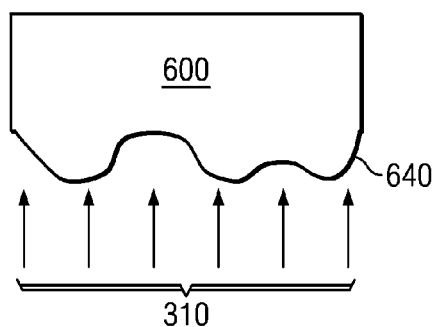
FIGS. 15A and 15B, illustrates an embodiment of the invention applied to polishing.
Figure 15B:
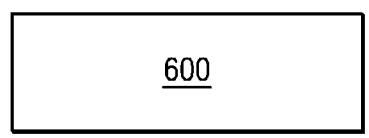

FIG. 15, which includes FIGS. 15A and 15B, illustrates an embodiment of the invention applied to polishing.

FIG. 15A illustrates the surface to be polished of a workpiece 600 having surface non-uniformities 640. The non-uniformities 640 may be surface roughness or may be a consequence of a deposition process such as an electro-chemical deposition (as in FIG. 5). The non-uniformities 640 are exposed to the etchant 310 as described previously to form a uniform surface as illustrated in FIG. 15B.

Figure 16A:
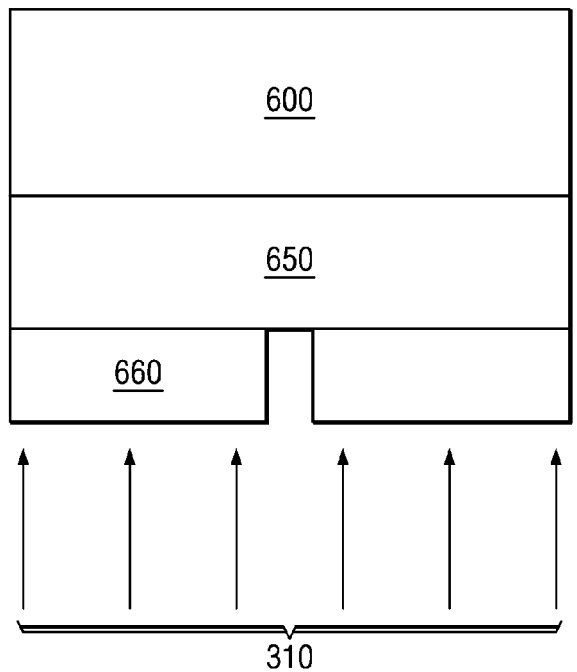
FIGS. 16A and 16B, illustrates an embodiment of the invention applied to etching metal lines.
Figure 16B:
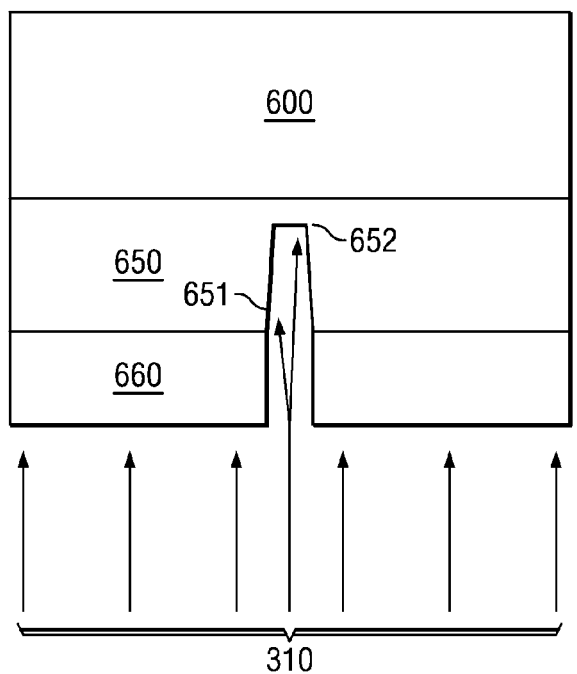

FIG. 16, which includes FIGS. 16A and 16B, illustrates an embodiment of the invention applied to etching metal lines.

Referring to FIG. 16A, a metal layer 650 to be etched has been formed over a workpiece 600. In various embodiments, the metal layer 650 comprises copper. In one embodiment, the metal layer 650 is pure copper line. In other embodiments, the metal layer 650 comprises a copper alloy, for example, having at least 80% copper.

A hard mask 660 is formed over the metal layer 650 and patterned using conventional lithography. Next, the metal layer 650 is exposed to the etchant 310 as described in various embodiments previously.

In this embodiment, the etchant 310 may further include a corrosion inhibitor to avoid oxidation and corrosion of the metal layer 650. Advantageously, the corrosion inhibitor reduces the etching rate of the metal layer 650, for example, by forming a protective layer over the metal layer 650.

However, the relative concentration of the corrosion inhibitor varies spatially. For example, the relative concentration of the corrosion inhibitor in the etchant 310 in a first region 651 is higher than in a second region 652. This is because the corrosion inhibitor comprises large organic molecules that diffuse slowly relative to the other (gas and liquid) components of the etchant 310, which may be inorganic molecules. This difference may be exacerbated with geometry, for example, for structures having a depth that is at least five times greater than a width, and about ten times in one embodiment. In other words, the faster diffusing components of the etchant 310 reach the bottom of the opening faster than the slower diffusing corrosion inhibitor. Consequently, the etching rate at the bottom of the opening (e.g., second region 652) is higher than the etching rate at the top of the opening (e.g., first region 651). This results in the formation of an opening with a high aspect ratio. Advantageously, in various embodiments, the use of the corrosion inhibitors with the etchant 310 magnifies the difference is diffusivity. Thus, the upper portion of the metal layer 650 is not etched during the subsequent etching of the deeper portions of the opening. In this manner, using this embodiment, any deep aspect ratio feature such as trenches, metal lines, vias, etc. may be formed by etching the metal layer 650.

In contrast, if a corrosion inhibitor is used with a conventional liquid etchant, the difference in etch rate is not significantly changed. The similar etching rates at the top and bottom of the opening result in significant undercutting. For example, copper from the top surface under the mask in the first region 651 is removed. Therefore, copper trenches and metal lines cannot be formed by etching copper metal layers.

As a consequence, copper metal lines are conventionally formed using damascene techniques because of the inability to subtractively etch copper layers. Embodiments of the invention overcome this issue by magnifying the impact of the corrosion inhibitors when used with the etchant 310.

As described in various embodiments, a material that comprises a metal may, for example, be a pure metal, a metal alloy, a metal compound, an intermetallic and others, i.e., any material that includes metal atoms. For example, copper may be a pure copper or any material including copper such as, but not limited to, a copper alloy, a copper compound, a copper intermetallic, an insulator comprising copper, and a semiconductor comprising copper.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIGS. 1-8 may be combined with the embodiments described in FIG. 9-12. Similarly, embodiments described in FIG. 13 or 14 may be combined with embodiments described in FIGS. 9-12. It is therefore intended that the appended claims encompass any such modifications or embodiments.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of polishing a device, the method comprising:
providing a layer having a non-uniform top surface over a chuck, the non-uniform top surface comprising a plurality of protrusions;
rotating a plurality of blades between the chuck and the layer to form a fluid comprising gas bubbles and a liquid; and
removing the plurality of protrusions by exposing the layer to the fluid.

2. The method of claim 1, wherein the gas in the gas bubbles is selected from the group consisting of oxygen, ozone, nitrogen, and hydrogen peroxide, and wherein the liquid comprises a liquid etchant.

3. The method of claim 2, wherein the liquid etchant comprises an etchant selected from the group consisting of sulfuric acid, hydrogen peroxide, hydrofluoric acid, ammonium fluoride, phosphoric acid, acetic acid, potassium hydroxide, ammonium hydroxide, and nitric acid.

4. The method of claim 1, wherein the fluid further comprises gas layers and gas dissolved in the liquid.

5. The method of claim 1, wherein the plurality of protrusions comprise the same material as the layer.

6. The method of claim 1, wherein the plurality of protrusions comprise particles attached to the layer, and wherein removing the plurality of protrusions comprises cleaning the top surface of the layer.

7. The method of claim 1, further comprising after removing the plurality of protrusions forming a metallization layer over the layer without performing a planarization process between removing the plurality of protrusions and forming the metallization layer, wherein the layer comprises copper, and wherein the plurality of protrusions comprise copper after an electro-chemical deposition process.

8. A method of fabricating a semiconductor device, the method comprising:
forming a layer having a non-uniform top surface over a substrate;
placing the substrate having the layer facing a chuck;
forming a fluid comprising gas bubbles and a liquid by generating a low pressure region above the chuck by rotating a plurality of blades over the chuck so that gas from a high pressure region under the chuck is sucked into a nozzle and mixes with the liquid to form the fluid within the nozzle;
ejecting the fluid through a central opening in the chuck to form a layer of the fluid over the chuck; and
planarizing the non-uniform top surface by exposing the layer to a flow of the fluid.

9. The method of claim 8, wherein the layer comprises copper.

10. The method of claim 8, wherein the layer is a pure copper layer or a copper alloy layer.

11. The method of claim 8, wherein the layer comprises a metal.

12. The method of claim 8, wherein forming a layer comprises using an electro deposition process.

13. The method of claim 8, wherein the flow of the fluid is turbulent.

14. The method of claim 8, wherein exposing the layer to a flow of a fluid comprises:
injecting the liquid into a nozzle disposed within the central opening of the chuck;
generating the fluid by adding the gas in the gas bubbles from a gas inlet into the liquid; and
exposing the layer to the fluid.

15. The method of claim 14, further comprising injecting the liquid into another nozzle disposed in an opening of the chuck, wherein exposing the layer to the fluid comprises releasing the fluid through the nozzle and the another nozzle.

16. The method of claim 14, further comprising rotating the chuck to generate a turbulent flow of the fluid on a top surface of the chuck.

17. The method of claim 14, further comprising rotating the chuck to generate a laminar flow of the fluid on a top surface of the chuck.

18. The method of claim 14, wherein the gas in the gas bubbles is selected from the group consisting of oxygen, ozone, nitrogen, and hydrogen peroxide, and wherein the liquid comprises a liquid etchant.

19. The method of claim 18, wherein the liquid etchant comprises a etchant selected from the group consisting of sulfuric acid, hydrogen peroxide, hydrofluoric acid, ammonium fluoride, phosphoric acid, acetic acid, potassium hydroxide, ammonium hydroxide, and nitric acid.

20. A method of fabricating a semiconductor device, the method comprising:
- depositing a metal layer over a substrate;
- forming a etch mask over the metal layer;
- placing the substrate having the metal layer facing a chuck;
- forming a fluid comprising gas bubbles and a liquid by generating a low pressure region above the chuck by rotating a plurality of blades over the chuck so that gas from a high pressure region under the chuck is sucked into a nozzle and mixes with the liquid to form the fluid within the nozzle;
- ejecting the fluid through a central opening in the chuck to form a layer of the fluid over the chuck; and
- using the etch mask, etching the metal layer by exposing the metal layer to the layer of the fluid.

21. The method of claim 20, wherein etching the metal layer comprises:
- using a corrosion inhibitor in the fluid to inhibit corrosion of the metal layer during the etching.

22. The method of claim 21, wherein the metal layer is a copper layer.

23. The method of claim 21, wherein the corrosion inhibitor diffuse slower than the other components of the fluid.

24. The method of claim 21, further comprising forming a metal line by etching the metal layer.

25. The method of claim 24, further comprising forming a via by etching the metal layer.

26. The method of claim 24, further comprising forming an opening having sidewalls and a bottom surface by etching the metal layer, the bottom surface exposing a portion of the metal layer.

27. A method of fabricating a semiconductor device, the method comprising:
- forming a layer having a non-uniform top surface over a substrate; and
- planarizing the non-uniform top surface by exposing the layer to a flow of a fluid, the fluid comprising gas bubbles and a liquid, wherein exposing the layer to a flow of a fluid comprises:
  - placing the substrate having the layer facing a chuck;
  - injecting the liquid into a nozzle disposed within a central opening of the chuck;
  - generating the fluid by adding the gas in the gas bubbles from a gas inlet into the liquid; and
  - exposing the layer to the fluid, wherein adding the gas in the gas bubbles comprises generating a low pressure region above the chuck by rotating the chuck so that the gas from a high pressure region under the chuck is sucked into the gas inlet.

28. A method of fabricating a semiconductor device, the method comprising:
- providing a chuck comprising an opening;
- injecting a liquid through a liquid inlet of a nozzle disposed in the opening;
- sucking a gas through a first gas inlet coupled to the nozzle;
- mixing the liquid with the gas within the nozzle to form a fluid comprising the liquid and gas bubbles comprising the gas; and
- releasing a flow of the fluid over the chuck from an outlet of the nozzle through the opening.

29. The method of claim 28, wherein the nozzle is disposed in a central region of the chuck.

30. The method of claim 28, wherein the nozzle is disposed in a peripheral region around a central region of the chuck.

31. The method of claim 28, further comprising another nozzle disposed in another opening of the chuck, the another nozzle coupled to the first gas inlet and the liquid inlet.

32. The method of claim 28, wherein the mixing is performed in a mixing chamber between the nozzle and the first gas inlet and between the liquid inlet and the mixing chamber.

33. The method of claim 28, further comprising rotating the chuck.

34. The method of claim 28, wherein sucking a gas through a first gas inlet comprises generating a pressure difference by forming a low pressure region above the chuck and a high pressure region under the chuck.

35. The method of claim 28, wherein sucking a gas through a first gas inlet comprises spinning a plurality of blades over the chuck.

36. The method of claim 28, wherein releasing a flow of the fluid over the chuck comprises releasing the fluid flowing turbulently.

37. The method of claim 28, further comprising increasing the turbulence of the fluid flowing over the chuck, wherein a top surface of the chuck is textured.

\* \* \* \* \*